United States Patent [19]

Sugino et al.

[11] Patent Number: 4,730,208
[45] Date of Patent: Mar. 8, 1988

[54] SEMICONDUCTOR DEVICE

[75] Inventors: Eitaro Sugino, Yokohama; Akira Morikuri, Kawaguchi, both of Japan

[73] Assignee: Tokyo Sahbaura Denki Kabushiki Kaisha, Kawasaki, Japan

[21] Appl. No.: 933,327

[22] Filed: Nov. 21, 1986

Related U.S. Application Data

[63] Continuation of Ser. No. 519,720, Aug. 2, 1983, abandoned.

[30] Foreign Application Priority Data

Aug. 9, 1982 [JP] Japan .................................. 57-138210

[51] Int. Cl.[4] ..................... H01L 29/78; H01L 27/02; H01L 29/04
[52] U.S. Cl. ................................. 357/23.8; 357/23.11; 357/23.13; 357/51; 357/52; 357/59
[58] Field of Search .................. 357/23.8, 23.11, 23.13, 357/51, 59 F, 52

[56] References Cited

U.S. PATENT DOCUMENTS

| 3,748,547 | 7/1973 | Sugimoto | 307/304 |
| 4,133,000 | 1/1979 | Greenstein | 357/51 |
| 4,285,001 | 8/1981 | Gerzberg et al. | 357/51 |

FOREIGN PATENT DOCUMENTS 44-20177  8/1969  Japan .................................. 357/51

Primary Examiner—Martin H. Edlow
Assistant Examiner—D. Featherstone
Attorney, Agent, or Firm—Oblon, Fisher, Spivak, McClelland & Maier

[57] ABSTRACT

A semiconductor device including an input circuit, in which an impurity region is formed in a semiconductor substrate under the input circuit. This impurity region has a conductivity type opposite to that of the substrate or at least has a lower impurity concentration than that of the substrate. According to this structure, the input voltage capability of the device is improved. Additionally, the fabrication methods of this semiconductor device are disclosed.

8 Claims, 10 Drawing Figures

SEMICONDUCTOR DEVICE

This application is a continuation of application Ser. No. 519,720, filed Aug. 2, 1983 now abandoned.

BACKGROUND OF THE INVENTION

1. Field of the Invention

This invention relates generally to a semiconductor device and methods of fabrication thereof, and more particularly to the improved structure and methods of fabrication of a semiconductor device including MOS FET circuits and input circuits connected thereto.

2. Description of the Prior Art

In the conventional device in which MOS FET circuits are provided, some resistor circuits are connected between the electrodes of MOS FET circuits and the bonding pads connected to outer input terminals. These resistor circuits work as protection circuits for the MOS FETs and especially prevent the gate insulator of the MOS FETs from being destroyed by any surge voltage applied to the input terminal.

The resistor circuit includes a doped polycrystalline silicon layer formed in the field insulator on a semiconductor substrate and is connected to the bonding pad and the electrodes of the MOS FETs by aluminum wiring layers formed on the field insulator. The conductivity type of the polycrystalline silicon layer is generally opposite to that of the semiconductor substrate. Semiconductor regions of the same conductivity type regions as the substrate are formed underlying the field insulator in the surface of the semiconductor substrate. These regions are channel stoppers, namely, used as protective regions so that no channels are formed in the field area of the substrate.

When a high voltage is applied to the input terminal of this conventional type semiconductor device, so many charges, electrons or holes are generated in the protective regions at the surface of the substrate that a strong transient electric field occurs between the bonding pads, aluminum wiring layers or polycrystalline resistors and the semiconductor substrate. This strong transient electric field often destroys the field insulator, especially under the bonding pads or polycrystalline resistors. As a result, the bonding pads or polycrystalline resistors are electrically connected to the substrate, and the input signal fails to be transmitted normally thereafter.

Japanese patent application No. 44-20177 discloses a semiconductor device structure including a semiconductor substrate having a first conductivity type, a second conductivity type region formed in the substrate, a gate insulating material covering the substrate and a bonding pad formed on the insulating material positioned above the second conductivity type region. This structure, however, has no protection resistor. Accordingly, this Japanese patent application has little relation to this invention.

SUMMARY OF THE INVENTION

It is according an object of this invention to provide a semiconductor device which is protected against destruction even when a high input voltage or a surge voltage is applied thereto.

It is another object of this invention to provide a method of fabricating a semiconductor device which is protected against destruction even when a high input voltage or a surge voltage is applied thereto.

A further object of this invention is to provide a semiconductor device and method of fabricating the same in which a field insulator formed under bonding pads and protection resistors may be prevented from being being destroyed even if a high input voltage or a surge voltage is applied to the bonding pads.

These and other objects are achieved according to the invention, by providing a novel semiconductor device in which a field insulator is formed under bonding pads and protection resistors are provided, wherein an opposite type impurity region or the same type impurity region, requiring lower or at least the same concentration, compared to that of the substrate, is provided in the surface area of the semiconductor substrate under the bonding pad and the protection resistor connected thereto. Therefore, this structure is protected against even an extremely high input voltage applied to the bonding pad.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
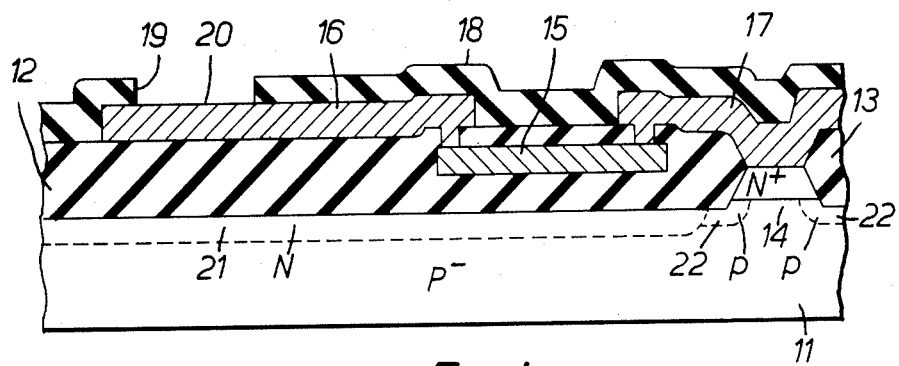
FIG. 1 is a cross-sectional view of the semiconductor device of one embodiment of this invention.

Referring now to the drawings, wherein like reference numerals designate identical or corresponding parts throughout the several views, and more particularly to FIG. 1 thereof, in the device of the invention thick oxide layers or field insulation layers 12, 13 are formed on a p—type silicon substrate 11. In the surface area of the silicon substrate 11 surrounded by these field insulation layers 12, 13, a $n^+$-type region 14 is formed. This $n^+$-type region 14 serves as a protection diode. In the field insulation layer 12, an $n^-$-type doped polycrystalline silicon layer 15 is provided. This polycrystalline silicon layer 15 works as a protection resistor which prevents the MOS FET connected thereto from being destroyed by high input voltage or surge voltage applied through an input terminal. On the insulation layer 12, there are aluminum wiring layers 16, 17, each connected to the polycrystalline silicon layer 15. These aluminum wiring layers 16, 17 and the field insulation layer 12 are covered with the protection layer 18 formed of phosphorous silicate glass (PSG). This protection layer 18 has a hole 19 in which a bonding pad 20 connected to an outer input terminal formed. As shown, the bonding pad 20 is the exposed surface of the aluminum layer 16 through this hole 19. The surface area of the silicon substrate 11 has n-type region 21 under this bonding pad 20, aluminum wiring layer 16 and the polycrystalline silicon layer 15. The surface area also has p-type region 22 under the field insulation layers 12, 13 except for the n-type region 21. This p-type region 22 works as the channel stopper in the field area. On the other hand, the n-type region 21 is formed in order to improve the high input voltage capability of the device. That is, if an extremely high input voltage (e.g., negative voltage) is applied to the bonding pad 20 transiently through the outer input terminal, a depletion layer generated between the n-type region 21 and the silicon substrate 11, extends towards the n-type region 21. The voltage applied between the bonding pad 20, aluminum wiring layers 16, 17 or polycrystalline silicon layer 15 and the silicon substrate 11 is divided not only by the field insulator 12 but also by this depletion layer. Namely the voltage to the field insulator 12 is substantially reduced by this depletion layer. Conversely, the electric field applied to the field insulation layer 12 is also reduced and the insulator 12 can hardly be destroyed locally by this electric field.

Referring now to FIGS. 2A-2F, next explained is the fabrication steps of the embodiment shown in FIG. 1.

Figure 2A:
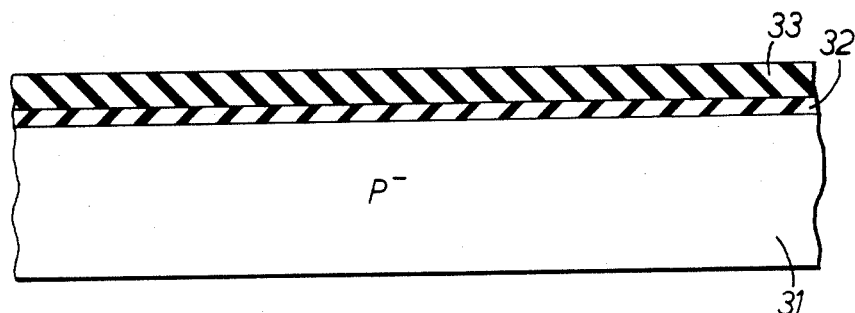
FIGS. 2A–2F are cross-sectional views of the device of FIG. 1 in various steps of fabrication.

In FIG. 2A, a silicon dioxide layer 32 is formed by oxidizing the p⁻-type silicon substrate 31. This silicon dioxide layer 32 is approximately 900 thick. The concentration of p⁻-type silicon substrate 31 is about $1 \times 10^{15}$ cm$^{-3}$. On the silicon dioxide layer 32, Si$_3$N$_4$ layer 33 whose thickness is approximately 2500 is deposited by a CVD method (Chemical Vaper Deposition method).

Figure 2B:
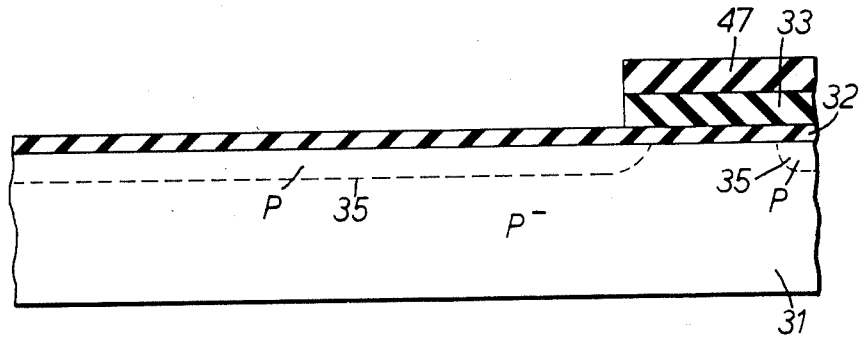

In FIG. 2B, a photoresist layer 34 is formed on the Si$_3$N$_4$ layer 33. Then the Si$_3$N$_4$ layer 33 or the surface area to be p- and n-type regions 35, 36 is selectively etched out using this photoresist layer 34 as a mask. Next boron ions are implanted in the silicon substrate 31 through the silicon dioxide layer 32 at an implanting energy of about 80 KeV and a density of $3 \times 10^{13}$ cm$^{-2}$ to form the channel stopper regions 35.

Figure 2C:
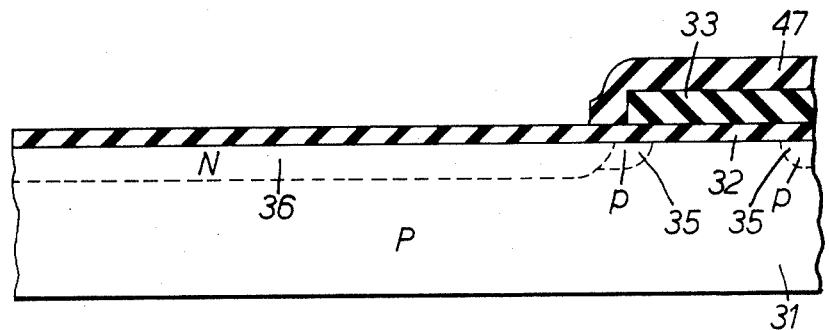

In FIG. 2C, after the boron implanting process, phosphorous ions are implanted in the silicon substrate 31 through the silicon dioxide layer 32 by using a photoresist layer 47 as a mask, at an implanting energy of 150 KeV and a density of $5 \times 10^{12}$ cm$^{-2}$ to form the n-type region 36. A small portion of p-type implanted region 35 under Si$_3$N$_4$ layer 33 still remains after this step.

Figure 2D:
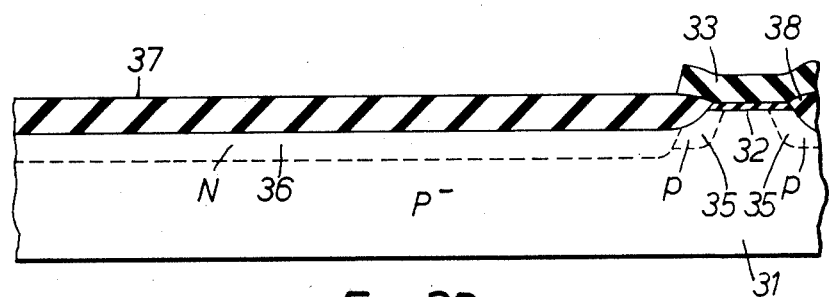

After the ion implanting process, the field insulation layers 37, 38 are formed by a local oxidation process by using the Si$_3$N$_4$ layer 33 as a mask in FIG. 2D. The portion of the substrate 31 under the remaining Si$_3$N$_4$ layer 33 is not oxidized to form an active device element.

Figure 2E:
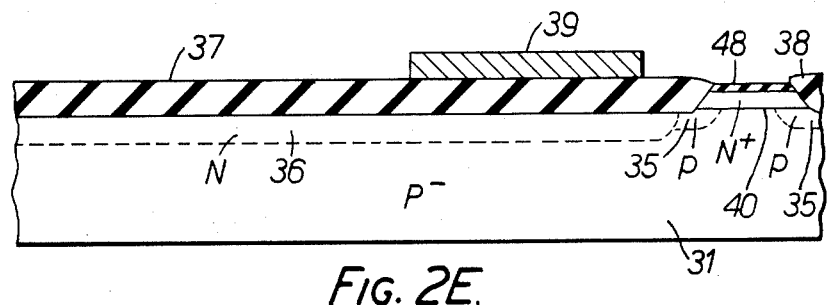

In FIG. 2E, after removing the Si$_3$N$_4$ layer 33 and the silicon dioxide layer 32, a gate oxide 48 is formed by thermal oxidation and a polycrystalline silicon layer is formed on the field insulation layer 38, 38 and the gate layer 48. This polycrystalline silicon layer is selectively etched out to form the polycrystalline silicon resistor 39. Next the phosphorous ions are doped into the silicon substrate 31 through the silicon dioxide layer 32 to form the n$^+$-type region 40 which is used as a protection diode. Simultaneously the polycrystalline silicon resistor 39 is also doped with phosphorous ions, which results in an n⁻-type conductivity.

Figure 2F:
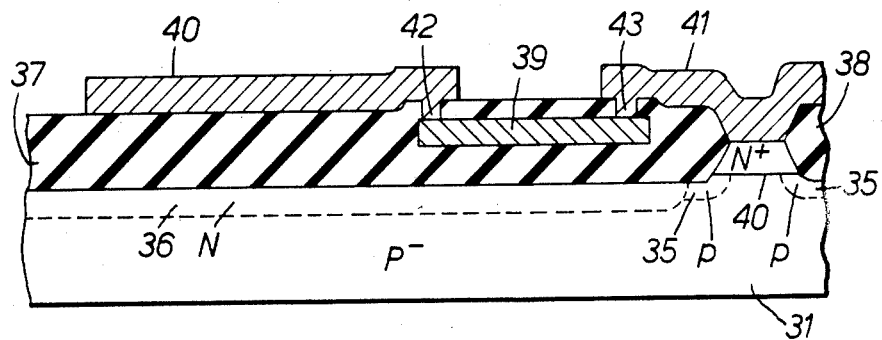

In FIG. 2F, the field insulation layers 37, 38 are grown by a CVD method and the contact holes 42, 43 are formed by a photolithographic process. An aluminum layer is evaporated over the field insulation layers 37, 38 and shaped to the wiring layers 40, 41 by a photolithographic process.

Figure 2G:
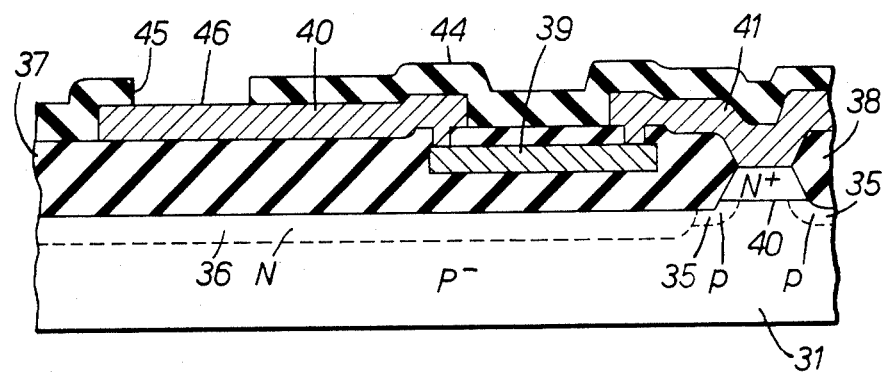

Finally, in FIG. 2G, a phosphorous silicate glass (PSG) layer 44 is deposited over the whole surface of the device by a CVD method and a hole 45 is formed in this PSG layer 44 by a photolithographic process. A bonding pad 46, i.e., the exposed surface of aluminum wiring layer 40 through this hole 45, results.

Referring to the structure of this device fabricated by the above described process, the thickness of the silicon dioxide layer 37 is approximately 1.2 $\mu$m and the thickness of the aluminum wiring layer 40 is approximately 1.1 $\mu$m. The impurity concentration of n-type region 36 is about $4 \times 10^{17}$ cm$^{-3}$ and that of p-type region 35 is about $1 \times 10^{17}$ cm$^{-3}$.

In this embodiment, the input voltage capability has been examined. As a result, even if about a 300 V input voltage is applied to the bonding pad, there occurs no local breakdown of the insulation layers.

In the conventional device in which the p-type channel stopper region instead of the n-type region of this embodiment is formed in the entire surface of the substrate underlying the field insulator, the input voltage capability has been only 250 V. Accordingly the reliability of the device has been highly improved according to the present invention.

Figure 3:
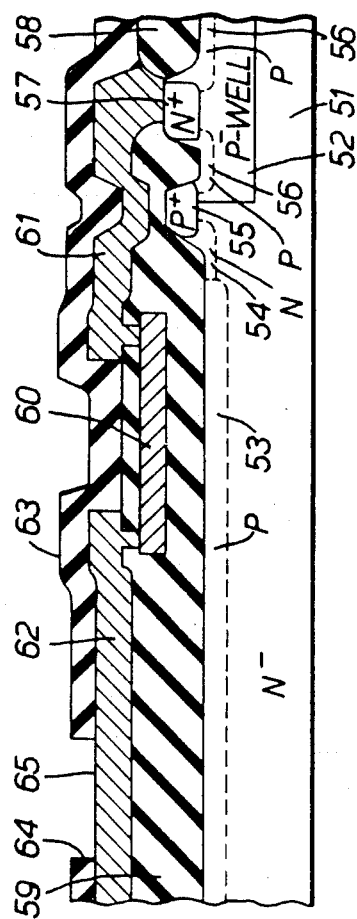
FIG. 3 is a cross-sectional view of a second embodiment of the semiconductor device of this invention.

FIG. 3 shows a second embodiment of this invention. This embodiment has a CMOS (Complementary Metal Oxide Semiconductor) structure. Namely the p⁻-type well 52 is formed in the n⁻-type silicon substrate 51 and the n$^+$-type diffused region 57 serving as the protection diode is formed in this p-type well 52.

In order to prevent leakage current from the p-type well 52, p$^+$-type guard ring 55 is formed surrounding the p⁻-type will 52. The p-type region 56 underlying the field insulator 58 is a channel stopper in p⁻-type well 52, and also n-type region 54 is channel stopper in an n⁻-type substrate. The p-type region 53 is formed underlying the field insulator 59 in the surface area of the n⁻-type silicon substrate 51. This p-type region 53 contributes to the high input capability of the device as already explained above in regard to the first embodiment. In the field insulator 59, the polycrystalline silicon layer 60 serving as protection resistor is formed, and aluminum wiring layers 61 and 62 are connected to this polycrystalline silicon layer 60. The top surface of the device in FIG. 3 is covered with a PSG layer 63 having a hole 64 in which a bonding pad 65 is formed.

In this second embodiment, the boron ion implanting process of the p-type channel stopper region 56 in p⁻-type well 52 and the p-type region 53 under the field insulation layer 59 is accomplished at the same step. Therefore, the process is not complicated by a separate step of fabrication for each of these regions.

Figure 4:
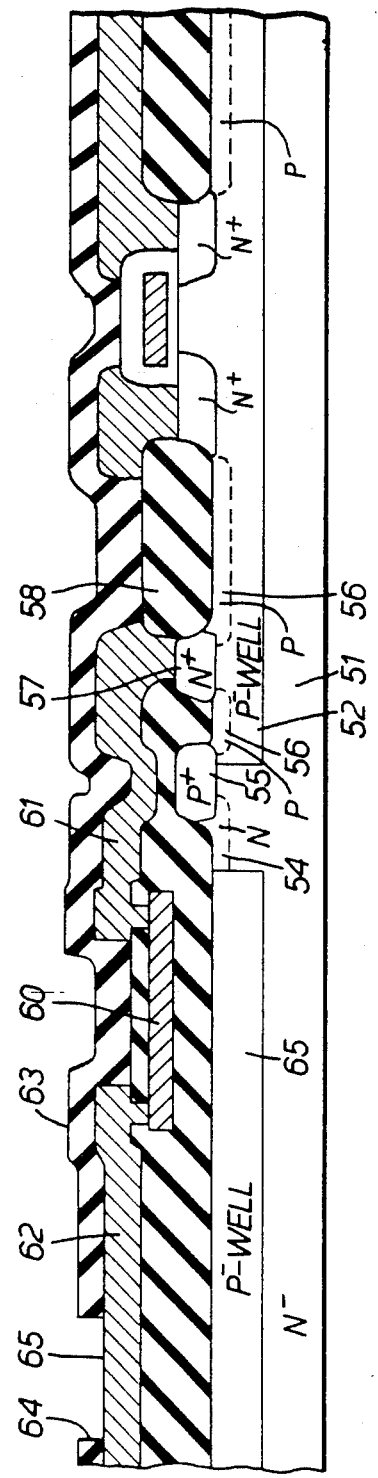
FIG. 4 is a cross-sectional view of a third embodiment of the semiconductor device of this invention.

FIG. 4 shows a third embodiment of this invention, which also has the CMOS structure. In this embodiment, the p⁻-type well 65, which is in a floating condition, is provided underlying the field insulation layer 59 to improve the high input voltage capability. The structure, except for this P⁻-type well 65, is the same as the second embodiment explained above. This p⁻-type well 65 may be provided at the same step as that of forming another p⁻-type well 52 in which the n⁻-channel MOS FET is formed. Accordingly, the process is uncomplicated, compared with the conventional process of forming the CMOS structure.

Although the regions provided in order to improve the high input voltage capability in the above embodiments, that is, the n-type region 21 in the first embodiment, the p-type region 53 in the second embodiment and the p⁻-type well 65 in the third embodiment, are formed in the entire surface area of the substrate under the bonding pad, aluminum wiring layers and polycrystalline silicon resistor, the scope of this invention is not limited to this structure. For example, the region for high input voltage capability may be formed only under the polycrystalline silicon resistor.

Further, although the region for high input voltage capability has the opposite conductivity to the substrate in these embodiments, the same conductivity type as the substrate may also be effective if the impurity concentration of the region is almost the same as or lower than that of the substrate. However, the efficiency for high input voltage capability is lower than that of the region having the opposite conductivity type relative to that of the substrate.

As is evident from the above description, the present disclosure adopts a convention for indicating relative doping concentrations, in which $n^+$-type and $p^+$-type doping indicates the highest doping concentration level, n-type and p-type doping indicates an intermediate level of doping of doping concentration, and $n^-$-type and $p^-$-type doping indicates the lowest doping concentration. This doping convention is fully consistent with the attached drawings.

Obviously, numerous modifications and variations of the present invention are possible in light of the above teachings. It is therefore to be understood that within the scope of the appended claims, the invention may be practiced otherwise than as specifically described herein.

What is claimed as new and desired to be secured by Letters Patent of the United States is:

1. A semiconductor device with MOS FET circuits, comprising:
   a semiconductor substrate having one conductivity type;
   an insulation layer formed on said substrate;
   an active portion formed in said substrate and coupled to the MOS FET circuits;
   an input protection resistor, having one end coupled to said active portion, formed on said insulation layer;
   a bonding pad, connected to another end of said input protection resistor, formed on said insulation layer;
   an impurity diffusion region having an opposite conductivity type relative to said one conductivity type formed underlying said insulation layer, said impurity diffusion region positioned at least under said input protection resistor and electrically maintained at floating potential level; and
   a channel stopper region having said one conductivity type and a higher impurity concentration than that of said substrate, formed underlying said insulation layer, said channel stopper region positioned at the surface portion of said semiconductor substrate except for the portion where said impurity diffusion region is formed;
   wherein said insulation layer overlying said impurity diffusion region is not thicker than that of said insulation layer overlying said channel stopper region and when a voltage of a predetermined polarity is applied across the bonding pad, the insulating layer and the substrate, a depletion layer is formed between said impurity diffusion region and the substrate such that the applied voltage is divided by the insulating layer and the depletion layer thereby to reduce the voltage existing across the insulating layer.

2. A semiconductor device as recited in claim 1, wherein said resistor comprises:
   a polycrystalline silicon layer.

3. A semiconductor device as recited in claim 1, comprising:
   said impurity diffusion region formed under said resistor and said bonding pad.

4. A semiconductor device as recited in claim 1 comprising:
   said resistor connected to said bonding pad by a conductive layer formed on said insulation layer; and
   said impurity diffusion region formed under said bonding pad, said conductive layer and said resistor.

5. A semiconductor device as recited in claim 1, comprising:
   a well region having a conductivity type opposite that of said substrate formed in said substrate, said active portion being formed in said well region; and
   a second impurity region having said opposite conductivity type, formed in a surface area of said well region except for said active portion, said second impurity region and said impurity diffusion region having been simultaneously formed.

6. A semiconductor device as recited in claim 2, comprising:
   a well region having a conductivity type opposite that of said substrate formed in said substrate, said active portion being formed in said well region; and
   a second impurity region having said opposite conductivity type, formed in a surface area of said well region except for said active portion, said second impurity region and said impurity diffusion region having been simultaneously formed.

7. A semiconductor device as recited in claim 1, comprising:
   a well region, having a conductivity type opposite that of said substrate, formed in said substrate, said active portion being formed in said well region, said well region and said impurity diffusion region having been simultaneously formed.

8. A semiconductor device as recited in claim 2, comprising:
   a well region, having a conductivity type opposite that of said substrate, formed in said substrate, said active portion being formed in said well region, said well region and said impurity diffusion region having been simultaneously formed.

* * * * *